United States Patent
Angelopoulos et al.

(10) Patent No.: US 6,543,617 B2
(45) Date of Patent: Apr. 8, 2003

(54) PACKAGED RADIATION SENSITIVE COATED WORKPIECE PROCESS FOR MAKING AND METHOD OF STORING SAME

(75) Inventors: Marie Angelopoulos, Cortlandt Manor, NY (US); Wu-Song Huang, Poughkeepsie, NY (US); Ranee Wai-Ling Kwong, Wappingers Falls, NY (US); David Robert Medeiros, Ossining, NY (US); Wayne Martin Moreau, Wappingers Falls, NY (US); Karen Elizabeth Petrillo, Mahopac, NY (US); Herman Russell Wendt, San Jose, CA (US); Christopher Karl Magg, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/802,471

(22) Filed: Mar. 9, 2001

(65) Prior Publication Data

US 2003/0019782 A1 Jan. 30, 2003

(51) Int. Cl.[7] .............................................. B65D 85/00
(52) U.S. Cl. ....................................... 206/701; 206/710
(58) Field of Search ................................ 206/454, 525, 206/524.3, 710, 706, 701, 719, 720, 722, 723; 428/343, 354; 430/5, 322, 323

(56) References Cited

U.S. PATENT DOCUMENTS

| | | | |
|---|---|---|---|
| 4,680,248 A | | 7/1987 | Roach |
| 5,091,233 A | * | 2/1992 | Kirby et al. .............. 206/524.8 |
| 5,811,184 A | * | 9/1998 | Anderson et al. ........... 206/701 |
| 5,875,897 A | | 3/1999 | Duncan et al. |
| 6,026,963 A | * | 2/2000 | Gray, III et al. ............. 206/710 |
| 6,037,097 A | | 3/2000 | Bucchignano et al. |
| 6,043,004 A | | 3/2000 | Bucchignano et al. |
| 6,074,459 A | | 6/2000 | Gingrich et al. |
| 6,114,273 A | | 9/2000 | Hayden |
| 6,117,405 A | | 9/2000 | Frey et al. |
| 6,120,860 A | | 9/2000 | Bowen et al. |
| 6,120,983 A | | 9/2000 | Okada et al. |

FOREIGN PATENT DOCUMENTS

EP            0 932 082 A2      7/1999

OTHER PUBLICATIONS

"Contamination Control During Shipping, Handling and Storage of Reticles," Sheng–Bai Zhu, In Metrology, Inspection, and Process Control for Microlothography XIV, SPIE, vol. 3998 (2000), pp. 565–572.

(List continued on next page.)

Primary Examiner—Luan K. Bui
(74) Attorney, Agent, or Firm—Ohlandt, Greeley, Ruggiero & Perle, L.L.P.; Daniel P. Morris

(57) ABSTRACT

The present invention includes a packaged coated workpiece. The packaged coated workpiece has: (1) a workpiece coated with a resist film sensitive to optical radiation, particulates or chemical contaminants; (2) an inner barrier sealed to enclose the coated workpiece and optionally a first getter agent, to produce a sealed first enclosure; and (3) an outer barrier sealed to enclose the sealed first enclosure and optionally a second getter agent, provided that the packaged coated workpiece has at least one getter agent, to produce a packaged coated workpiece suitable for storage for a period of at least one week without substantial loss of sensitvity, resolution or performance. The present invention also includes a process for preparing a packaged coated workpiece and a method of increasing the storage time of a coated workpiece to at least one week without substantial loss of sensitivity, resolution or performance.

49 Claims, 5 Drawing Sheets

OTHER PUBLICATIONS

"Effect of Overcoats on Environmental Stability of a Chemically Amplified Positive Resist Against Water and Organic Bases," Nakamura et al., Journal of Photopolymer Science and Technology, vol. 8, No. 4 (1995), pp. 555–560.

"Performance of Positive Tone Chemically Amplified Resists For Next Generation Photomask Fabrication," Segawa et al., SPIE vol. 3236, pp. 82–92, date unknown.

"Investigation of Deep UV Resist by NMR: Residual Casting Solvents, Chemistries, and PAG Decomposition in Film," Ito et al., Journal of Photopolymer Science and Technology, vol. 12, No. 4 (1999), pp. 625–636.

"Influence of Organic contamination on Resist Profiles," Czech et al., Microelectronic Engineering 23 (1994) pp. 331–335.

"Influence of Polymer Properties on Airborne Chemical Contamination of Chemically Amplified Resists," Hinsberg et al., SPIE, vol. 1925, pp. 43–51.

"Effect of Gaseous Permeability of Overcoat Layer on KrF Chemically Amplified Positive Resists," Kishimura et al., J. Vac. Sci. Technol. B 14(6), Nov./Dec. 1996, pp. 4234–4238.

"Development of Ammonia Adsorption Filter and its Application to LSI Manufacturing Environment," Saiki et al., Journal of Photopolymer Science and Technology, vol. 8, No. 4 (1995) pp. 599–606.

(Abstract Only) "Acid Rain reduced in Eastern United States," Lynch et al. Environment Science and Technology, vol. 34, No. 6, 2000, pp. 940–949.

(Abstract Only) "Outdoor Air Concentrations of Nitrogen Dioxide and Sulfur Dioxide and Prevalence of Wheezing in School Children," Epidemiology vol. 11, No. 2, Mar. 2000, pp. 153–160. 153–160.

(Abstract only) "On the Origin of SO2 above Northern Greece," Zerefos et al., Geophysical Research Letters, vol. 27, No. 3, 2000, pp. 365–368.

(Abstract Only) "Environmental Risk Factors (Outdoor Air Pollution and Climatic Changes and Increased Trend of Respiratory Allergy," D'Amato et al., Journal of Investigational Allergology and Clinical Immunology, vol. 10, No. 3, May–Jun. 2000, pp. 123–128.

"A CA Resist with High Sensitivity and Sub 100nm Resolution for Advanced Mask Making," Huang et al., Photomask and Next Generation Lithography Mask, VII, Proceedings of SPIE vol. 4066 (2000).

PCT International Search Report, Sep. 23, 2002.

XP008008246, Saiki et al., *"Development of Ammonia Adsorption Filter and its Application to LSI Manufacturing Environment"*, Journal of Photopolymer Science and Technology, vol. 8, No. 4, 599–606, 1995.

XP–002214294, *"Oxygen Absorb food Package Long Storage Preparation Mix Magnesium Hydroxide Hydrosulphite Silica Gel"*.

* cited by examiner

PACKAGED RADIATION SENSITIVE COATED WORKPIECE PROCESS FOR MAKING AND METHOD OF STORING SAME

BACKGROUND OF THE INVENTION

1. Field of the Invention

The present invention relates to a coated workpiece packaged in a sealed enclosure comprising one or more barriers and getter agents in an enclosure substantially free of chemical contaminants for storage without loss of sensitvity, resolution or process latitude. More particularly, the present invention relates to a package for storing environmentally sensitive resist-coated mask blanks.

2. Description of the Related Art

Chemically Amplified Resists (CAR) are extremely sensitive to contaminants. In microelectronic device manufacturing, Chemically Amplified Resists are generally manufactured and used on site in controlled environments and tool sets. They are not packed for storage. In mask blank writing, the mask blank manufacturer coats the blanks with a Chemically Amplified Resist, generally in a mask shop, and ships them to a location where they can be exposed and subsequently processed into a mask. In such cases, packaging is of great importance.

One of the problems associated with the manufacture and shipping of resist-coated mask blanks has been the variability in the performance of the resist-coated mask blanks resulting from variable degree of contamination. Because the presence of a defect in the resist-coated mask blanks can not be detected by practical methods at an early stage, such defects do not surface until at a very advanced stage of use, i.e., after many hours of imaging and development work when degradation of the properties of the resist-coated mask blanks become obvious.

Proper storage of coated films of photosensitve materials is a common problem associated with humidity, heat, and solvent absorption. These effects are described, for example, in: (1) U.S. Pat. No. 6,120,983; (2) an article by H. Ito and M. Sherwood, *J. Photopolymer Science and Tech.*, 12, 625–636 (1999), which discloses an investigation of a DUV resist by No including aspects of residual casting solvent and PAG decomposition in a film and storage effects; and (3) G. Czech, et al., *Microelectronic Engineering*, 23, 331–5 (1994), which describes the influence of DMF on profiles of chemically amplified resists. In addition, the chemically amplified resists are susceptible to absorption of amines and moisture, as described in an article entitled "Airborne Contaminants and Chemically Amplified Resist Stability" by W. Hinsberg, S. MacDonald, N. Clecak, C. Snyder and H. Ito, *SPIE Proceed.*, 1925, 43–53 (1993). U.S. Pat. Nos. 5,985,524; 5,962,184; 5,861,231; 5,712,078; 5,585,220; 5,296,332 and 4491628 describe chemically amplified resist (CAR) based on acid catalyzed removal of acid sensitive resists containing acid sensitive functional groups, such as, t-butylesters, carbonates, acetals or ketals. Base sensitive resists are also known. Both type resists have been developed over the last twenty years as fast resists of high resolution for photolithography with doses of <50 mJ/cm$^2$ and for electron beams in the range of <50 $\mu$C/cm$^2$.

Fast and high resoltuion resists that are exposable by electron beams or laser beams at all wavelengths are also vital for next generation production of photomask blanks (see "Positive Chemically Amplified Resist for Next Generation Photomask Fabrication" by T. Segaw et al., *SPIE Proceed.*, 3236, 82–93 (1999)). In this process, precoated plates of resist on chrome covered quartz are written by a laser or electron beam pattern generator. Precoated plates are generally received from a blank manufacturer.

Because the films of resist are very thin, i.e., <400 nm thick, a coated six inch square plate has only about 10 mg of resist which would be susceptible to microgram levels of absorbed acid, which may subsequently catalyze the deprotection reactions of the amplified resists. Thus for long term storage of the CAR resists, the storage environment should be free of even minute quantities of acids, particularly acids having a $pK_a$<6, bases having a $pK_b$<6, as well as solvents and moisture. Ambient air contains moisture and can also contain acid precursors, such as, sulfur dioxide ($SO_2$) and nitrogen oxide ($NO_2$), which are common contaminants in the environment occuring generally at ppm levels. For contamination caused by acid precursors, see J. Lynch, C. VanBowersox and J. Grimm, *Environmental Science and Technology*, 34, 940–9 (2000).

Prior art attempts to preserve chemically amplified resist (CAR) have involved providing a topcoat of polyacrylic acid, as described in an article entitled "Effect of Gaseous Peremeability of Overcoat Layer on KrF Chemically Amplified Positive Resists" by S. Kishimura, J. Sakai, K. Tsujita and Y. Matsui, *J. Vac. Sci and Tech.*, B14, 4234–8 (1996), or filtering the contacting environment to remove ammonia and amines, as described in an article entitled "Development of Ammonia Absorption Filter and Its application in LSI Manufacturing Environment" by A. Saiki, et al., *J. Photopolymer Science and Tech.*, 8, 599–606 (1995). In some cases, such topcoats have caused deteriorated performance (process scumming) and/or have introduced coating defects to the resist film, as described in the previously cited S.Kishimura, J. Sakai, K. Tsujita and Y. Matsui, *J. Vac. Sci and Tech.*, B14, 4234–8 (1996). Filtration of the process air has been used to prevent "T-top" scumming during the post-expose bake, as described in previously cited W. Hinsberg, S. MacDonald, N. Clecak, C. Snyder and H. Ito, *SPIE Proceed.*, 1925, 43–53 (1993) and A. Saiki, et al., *J. Photopolymer Science and Tech.*, 8, 599–606 (1995). However, this approach has not been used with acidic vapors or under long term storage conditions.

U.S. Pat. No. 6,120,860 describes a package to store reactive liquid organic amines inside a bag. The package uses aluminzed nylon coated with polyvinylidene chloride. This patent does not make any reference to storage of a workpiece coated with a resist film that is sensitive to optical radiation, particulates or chemical contaminants, including outgassing acids, vapors and moisture. No getter agents are included in this package.

Acid catlyzed deprotection of radiation sensitive chemically amplified polyhydroxystyrene ketal resists used for mask-making and their storage is described in U.S. Pat. Nos. 6,043,003 and 6,037,097 and W. Huang, et al., "A CA Resist with High Sensitivity and sub 100 nm Resolution for Advanced Mask Making," Proceedings of SPIE, Vol. 4066, pages 150–159 (2000). Attempts to preserve plates by packaging the coated plates in a single layer polymer package, i.e., a single plastic bag, are described in U.S. Pat. Nos. 6,043,003 and 6,037,097. However, this method is not adequately effective. For example, it is not effective aginst permeation of acidic or basic organic or inorganic vapors or potential outgassing acids, vapors and moisture from the packaging materials themselves, from the resist coated mask blanks or from the carrier or holder of the resist coated mask blanks.

None of the above references describe storage of environmentally sensitive resist-coated mask blanks without loss of sensitvity, resolution or process latitude in an enclosure substantially free of chemical contaminants. None of the above references substantially addresses the problem of variability in the performance of the resist-coated mask blanks resulting from variable degree of contamination. Because the presence of a defect in the resist-coated mask blanks can not be detected by practical methods at an early stage, such a defect does not surface until at a very advanced stage of use, i.e., after many hours of imaging and development work when degradation of the properties become observable. None of the above references has a solution to the problem of variability in the performance of the resist-coated mask blanks or suggests a method of producing reprodicible performance attributes. Thus, there is a great need in industry for means for reproducibly storing such coated films of photosensitve materials without loss of sensitvity, resolution, process latitude and performance.

It is highly desirable that plates coated with photosensitve materials should last at least three months and the resist should not change in dose to print or in linewidth more than about 5%. Furthermore, since the chemically amplified resist (CAR) films would be particularity sensitive to moisture and acid precursors, such as, $SO_2$ and $NO_2$, the physical or chemical removal of the vapors inside the package to store photomask blanks would be highly desirable for protection against infiltration of reactive vapors and outgassing contaminants.

Accordingly, it is the object of this invention to provide a packaged material, such as a coated chemically amplified or non-chemically amplified resist plate, a process for preparing such a packaged material and a method of storing such a material inside a package for a period of at least three months to preserve the sensitvity, resolution and performance thereof after such a storage.

SUMMARY OF THE INVENTION

The present invention includes a packaged coated workpiece comprising: (1) a workpiece coated with a resist film sensitive to optical radiation, particulates or chemical contaminants; (2) a sealed enclosure comprising one or more barriers for isolating the coated workpiece from an outside environment; and (3) one or more getter agents for producing an enclosure substantially free of chemical contaminants; wherein the packaged resist coated workpiece is suitable for storage for a period of at least one week without substantial loss of sensitvity, resolution or process latitude.

The present invention also includes a packaged coated workpiece comprising: (1) a workpiece coated with a resist film sensitive to optical radiation, particulates or chemical contaminants; (2) a sealed enclosure comprising an inner barrier and outer barrier for isolating the coated workpiece from an outside environment; and (3) at least one getter agent enclosed within the inner barrier and/or the outer barrier for producing an enclosure substantially free of chemical contaminants. The packaged coated workpiece is suitable for storage for a period of at least three months without substantial loss of sensitvity, resolution or process latitude.

The present invention further includes a packaged coated workpiece comprising: (1) a workpiece coated with a resist film sensitive to optical radiation, particulates or chemical contaminants; (2) an inner barrier sealed to enclose the coated workpiece and optionally a first getter agent, to produce a sealed first enclosure; and (3) an outer barrier sealed to enclose the sealed first enclosure and optionally a second getter agent, provided that the packaged coated workpiece has at least one getter agent, to produce a packaged coated workpiece. The coated workpiece is suitable for storage for a period of at least one week without substantial loss of sensitvity, resolution or performance.

The present invention still further includes a process for preparing a packaged coated workpiece suitable for storage for a period of at least one week without substantial loss of sensitvity, resolution or performance. The process comprises the step of sealing a coated workpiece and a getter agent in a barrier to enclose the coated workpiece and the getter agent to produce the packaged coated workpiece. In another embodiment, the process comprises the steps of: (a) sealing a coated workpiece and optionally a first getter agent in an inner barrier to enclose the coated workpiece and the optional first getter agent to produce a sealed first enclosure; and (b) sealing the sealed first enclosure and optionally a second getter agent in an outer barrier to enclose the sealed first enclosure and the second optional getter agent to produce the packaged coated workpiece, provided that the packaged coated workpiece has at least one getter agent.

The present invention additionally includes a method of increasing the storage time of a coated workpiece to at least one week without substantial loss of sensitvity, resolution or performance. The method comprises packaging a coated workpiece by a process comprising the step of sealing a coated workpiece and a getter agent in a barrier to enclose the coated workpiece and the getter agent to produce the packaged coated workpiece. In another embodiment, the method comprises packaging a coated workpiece by a process comprising: (a) sealing a coated workpiece and optionally a first getter agent in an inner barrier to enclose the coated workpiece and the optional first getter agent to produce a sealed first enclosure; and (2) sealing the sealed first enclosure and optionally a second getter agent in an outer barrier to enclose the sealed first enclosure and the optional second getter agent to produce the packaged coated workpiece, provided that the packaged coated workpiece has at least one getter agent.

Using a combination of barrier materials and getter materials, the present invention provides a package system for storing a coated workpiece, such as a chemically amplified or non-chemically amplified resist plate, in a substantially dust free and chemically inert environment, for a period of at least one week without substantial loss of sensitvity, resolution and performance.

DETAILED DESCRIPTION OF THE INVENTION

Figure 1:
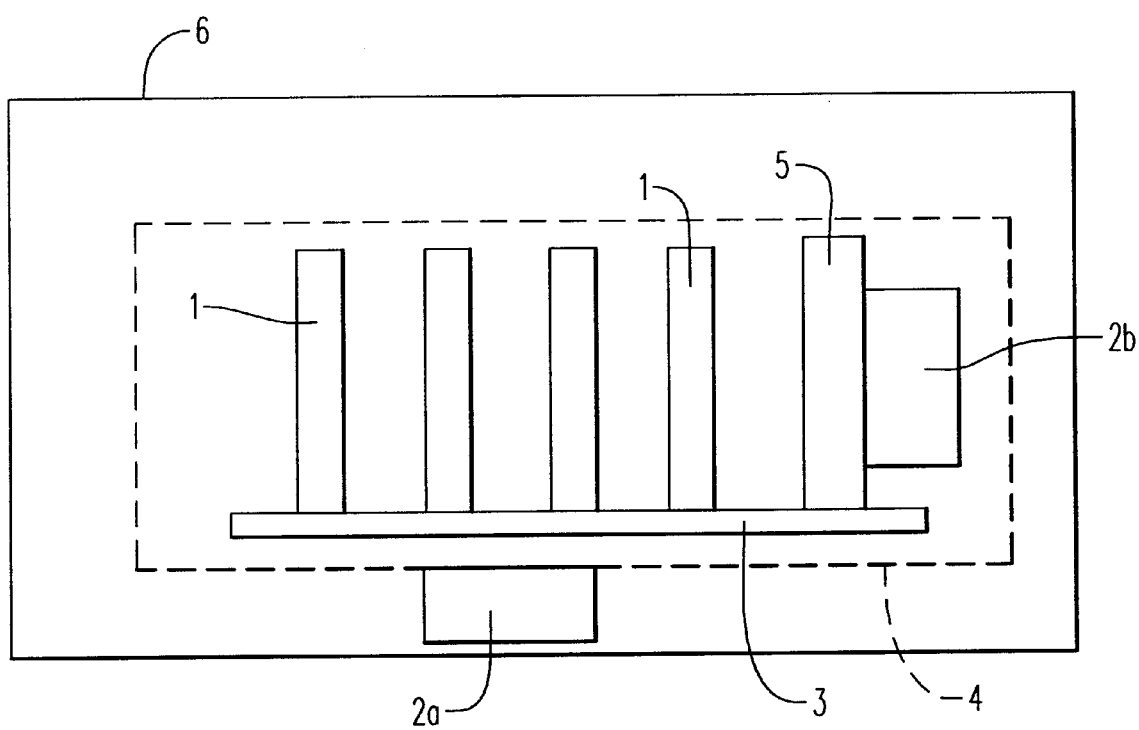
FIG. 1 is a schematic of a packaged coated workpiece in a sealed enclosure. The sealed enclosure comprises a single barrier and contains one or more getter agents.

It has been discovered that a packaging structure having a single barrier, preferably two barriers, such as an inner and an outer barrier, sealed to enclose a getter agent, such as, a physical or chemical getter agent for moisture, acids and bases, provides superior preservation of resist coated blanks.

In one embodiment, the present invention includes a coated workpiece and a getter agent enclosed in a single barrier.

The coated workpiece typically is a plate coated with a resist film, which can be a chemically amplified resist or a non-chemically amplified resist. Preferably, the coated workpiece is a resist-coated mask blank, such as, a resist-coated chrome film on a quartz blank.

Preferably, the coated workpiece is a substrate suitable for microelectronic device fabrication or is a substrate suitable for fabrication of a mask, such as, an electron beam mask, x-ray mask, particle beam mask, excited state atom beam mask, ion beam mask or a photo mask.

In another embodiment, the present invention includes a coated workpiece and a getter agent enclosed in a sealed inner barrier producing a first sealed enclosure. The first enclosure and a second getter agent are further sealed in an outer barrier to produce the packaged coated workpiece according to this embodiment.

The packaged coated workpiece can further have a sealed intermediate enclosure between the inner barrier and the outer barrier, i.e., an intermediate barrier sealed to enclose the sealed first enclosure and optionally an intermediate getter agent. The packaged coated workpiece can still further have additional intermediate barriers.

The packaged coated workpiece is suitable for storage for a period of at least one week, preferably for a period of at least three months without substantial loss of sensitvity, resolution or performance.

The outer barrier provides a high barrier layer to infiltration of acidic, basic vapors and moisture. The outer barrier encloses one or more getters packaged in a microporous material to eliminate contamination by particulates. The microporous material typically is a nanoporous membrane prepared from, for example, a fluorinated hydrocarbon material. Preferably, the fluorinated hydrocarbon material is a fluorocarbon, vinylidene fluoride homopolymer, vinylidene fluoride copolymer, Goretex™, Teflon™ or a combination thereof.

The inner barrier contains the coated workpiece, which typically is a coated plate, placed preferably in a upright holder. Getter agents are included inside the inner barrier to provide additional protection against the contaminants.

It is highly desirable that the packaging materials themselves are not inherently prone to potential outgassing acids, vapors and moisture. Preferably, the packaging materials are prepared, i.e., dried or degassed, so that they are substantially free of potential outgassing acids, vapors, or moisture. Preferably, the barriers are sealed during packaging in a dry inert gas atmosphere substantially free of residual acids, amines and moisture.

The inner and outer barriers are formed from a material, such as, a metal foil, a plastic or a filled plastic. The barrier material can be a carbon filled plastic, graphite filled plastic, metal particle or metal fiber filled plastic, organic or inorganic ionic conductor filled plastic, ultraviolet absorber containing plastic, infrared absorber containing plastic, or a combination thereof Preferably, the barrier material for both inner and outer barriers is impervious to optical radiation, including ultraviolet (UV), deep ultraviolet and visible radiation. This barrier material is also impervious to particulates, such as, dust.

Further, the inner and outer barriers are formed from a material which is impervious to a chemical contaminant. However, the inner barrier can optionally have one or more openings. Such openings make the inner barrier pervious to chemical contaminants, including chemical contaminants that form outgassing acids, vapors and moisture form the coated workpiece. These openings in the inner barrier may be covered by a microporous material.

After covering the openings in the inner barrier with a microporous material, the inner barrier will remain pervious to chemical contaminants but impervious to particulates. Each of the inner and outer barriers can be a sealable bag.

Such chemical contaminants typically are solid, liquid or vapor contaminants capable of causing a reduction in at least one performance property of the coated workpiece. The chemical contaminant comprises an acid precursor or a base precursor. The acid precursor comprises $NO_2$ and $SO_2$ emissions and moisture but the chemical contaminant is an acid, a base or moisture.

Depending on its nature, a getter agent can perform a one or more of the following functions: (1) neutralize acidic contaminants; (2) neutralize basic contaminants; and (3) maintain a desired relative humidity level within the enclosure, for example, of less than 25% at room temperature.

Each of the first and the second getter agents can independently be a chemical drying agent, an absorbent for water, an absorbent for a base, an absorbent for an acid, an absorbent for a gas or a combination thereof Although only one or two types of a getter agents can be used if the nature of the contaminant is predictable or known, it is preferable that a combination of a chemical drying agent, an absorbent for water, an absorbent for a base, an absorbent for an acid and an absorbent for a gas are all included in the package to ensure protection against any type of contaminant that can have a deleterious effect on the resist coated mask blank. Thus, for example, a preferred getter agent is a combination of silica gel, activated charcoal and potassium carbonate which can neutralize the acidic or basic contaminants and also maintain within the enclosure the desired relative humidity level.

The getter agents include acidic alumina, basic alumina, acidic silica gel, basic silica gel, activated charcoal, citric acid, potassium carbonate, an amine, magnesium sulfate, sodium sulfate, and combinations thereof Numerous other getter agents know to a person of ordinary skill in the art can also be used. Preferably the getter agent is a combination of silica gel, activated charcoal and potassium carbonate for neutralizing acidic and/or basic contaminants, absorbing gaseous contaminats and also for maintaining within the enclosure a relative humidity level of less than 25% at room temperature.

While inclusion of a getter agent in any of packaged coated workpiece is optional, the final packaged coated workpiece must have at least one getter agent within the overall packaged structure.

Referring to FIG. 1, schematic of a packaged, coated workpiece, such as, resist coated mask plates 1 in a sealed enclosure is shown. The sealed enclosure includes a single barrier 6. Preferably, the resist coated mask plates 1 are disposed in grooves on plate carrier 3, which can be a plate fixture. The sealed enclosure contains a getter agent placed in getter holding pillows 2a and 2b.

The plate carrier 3 has a dummy plate 5, which holds a getter agent located in getter holding pillow 2b. The resist coated mask plates 1, the dummy plate 5 holding getter holding pillow 2b and the plate carrier 3 may be optionally placed in housing 4. Housing 4 can be a sealed enclosure, such as a box, or can be an enclosure having one or more openings to permit removal of the contaminants by the getter agent in the getter holding pillow 2a. The resist coated mask plates 1, the dummy plate 5, getter holding pillow 2b and the plate carrier 3, in housing 4 (if present), are placed directly in barrier 6 along with getter holding pillow 2a so that additional getter capacity is provided by the getter holding pillow 2a.

The coated workpiece, i.e., the coated plate, can be a single piece or can be an array of several pieces. They can be placed within the package in any order, arrangement or configuration. Preferably, the plates are placed on a carrier, such as, a plate carrier. Alternatively, a fixture to hold the coated plates in place can be used.

In addition to coated plates, the plate carrier 3 has a dummy plate 5, which holds a getter agent located in getter holding pillow 2b. Preferably, getter holding pillow 2b is placed on the dummy plate 5 and secured by means for holding using, for example, a spring holder. The spring holder secures the getter pillow 2b to stay in place on the dummy plate. Preferably, the dummy plate 5 has an opening upon which the getter holding pillow 2b is placed and secured so that the getter holding pillow 2b is in contact with the surrounding atmosphere from both sides of the pillow, thereby doubling the effective surface area exposed to the surrounding atmosphere.

Figure 2:
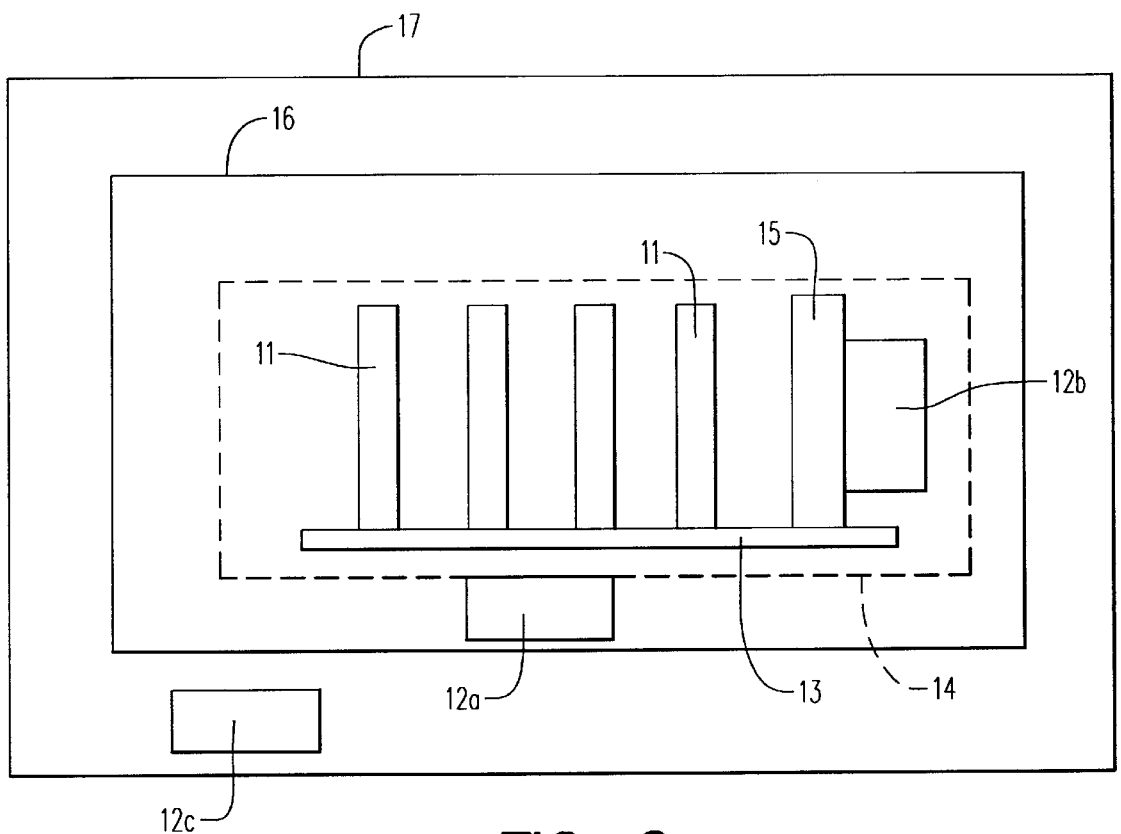
FIG. 2 is a schematic of a packaged coated workpiece in a two barrier sealed enclosure.

Referring to FIG. 2, schematic of a packaged coated workpiece, such as, resist coated mask plates 11 in a sealed enclosure having multiple barriers is shown. The sealed enclosure includes an outer barrier 17 enclosing getter holding pillow 12c and inner barrier 16 and its contents. Both outer barrier 17 and inner barrier 16 are formed from a material that is impervious to chemical contaminants. The inner barrier can optionally have one or more openings, which make the inner barrier pervious to chemical contaminants. If the openings in the inner barrier 16 are covered using a microporous material, it will still remain pervious to chemical contaminants but impervious to other contaminants.

In this embodiment, the contents of the sealed inner barrier 16 include, as in FIG. 1 above, resist coated mask plates 11, preferably disposed in grooves on plate carrier 13, which can alternatively be a plate fixture. The sealed inner barrier 16 contains getter agents placed in getter holding pillows 12a and 12b. The plate carrier 13 has a dummy plate 15, which holds a getter agent located in getter holding pillow 12b. The resist coated mask plates 11, the dummy plate 15 holding getter holding pillow 12b and the plate carrier 13 may be optionally placed in housing 14. Housing 14 can be a sealed enclosure, such as a box, or can be an enclosure having one or more openings to permit removal of the contaminants by the getter agent in the getter holding pillow 12a. The resist coated mask plates 11, the dummy plate 15, getter holding pillow 12b and the plate carrier 13, in housing 14 (if present), are placed directly in inner barrier 16 along with getter holding pillow 12a so that additional getter capacity is provided by the getter holding pillow 12a.

Additional getter capacity is provided by the getter holding pillow 12c because of the free flow of vapors and gases through the openings in the inner barrier 16 between the volume defined by the inner barrier and the volume formed between the inner and outer barriers. As mentioned above, the inner barrier 16 will remain pervious to chemical contaminants even when the openings are covered with a microporous material.

Figure 3:
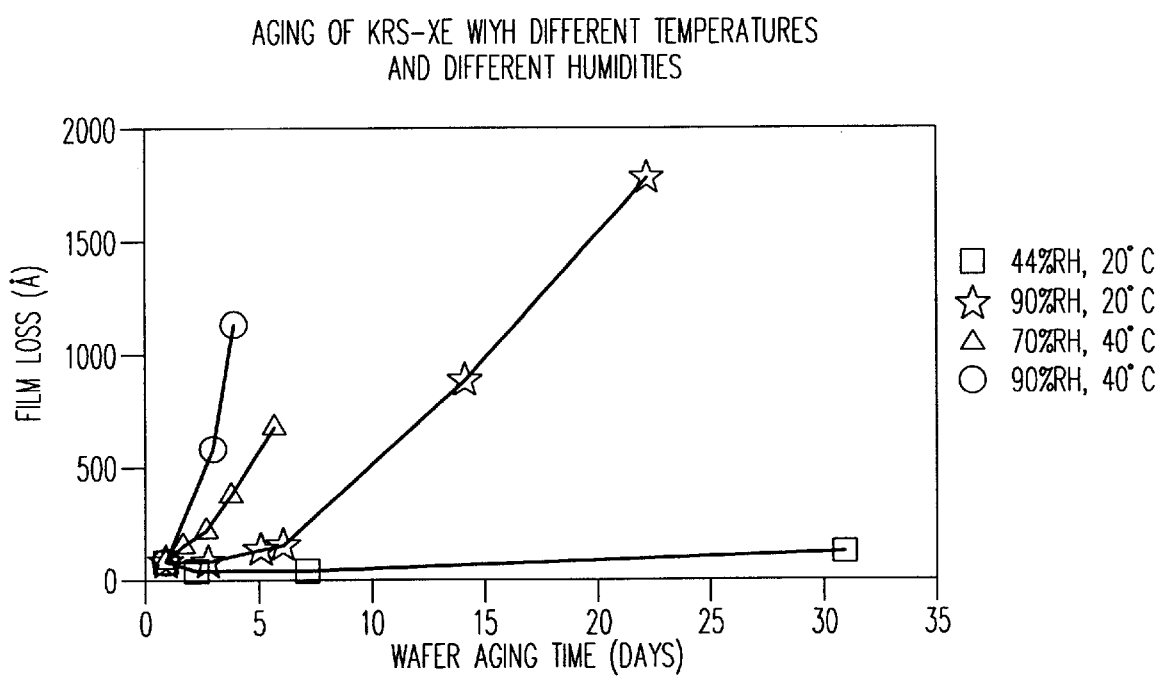
FIG. 3 is a plot of film loss versus wafer aging time for aging of KRS-XE wafers at different temperatures and humidities.

Referring to FIG. 3 a plot of film loss versus wafer aging time for aging of KRS-XE resist coated wafers packaged according to the present invention at different temperatures and humidities can be seen. In the absence of getter agents, film loss after 30 days of storage was significant even at low temperatures and humidity, such as, at 20° C. temperature and 44% relative humidity. At higher temperatures and humidities, film loss after just a few days of storage was dramatic.

Referring to FIGS. 4a, 4b, 4c and 4d, Scanning Electron Micrographs (SEM) of KRS-XE resist coated wafers resolved to 100 nm equal lines and spaces using two doses and after differing degrees of storage can be seen: a) 20 $\mu C/cm^2$ after 50 days storage; b) 21 $\mu C/cm^2$ after 50 days storage; c) 20 $\mu C/cm^2$ after 0 days storage (control); and d) 21 $\mu C/cm^2$ after 0 days storage (control).

Referring to FIGS. 5a, 5b, 5c and 5d, Scanning Electron Micrographs (SEM) of KRS-XE resist coated wafers resolved to 75 nm equal lines and spaces using two doses and after differing degrees of storage can be seen: a) 20 $\mu C/cm^2$ after 50 days storage; b) 21 $\mu C/cm^2$ after 50 days storage; c) 20 $\mu C/cm^2$ after 0 days storage (control); d) 21 $\mu C/cm^2$ after 0 days storage (control).

Figure 4A:
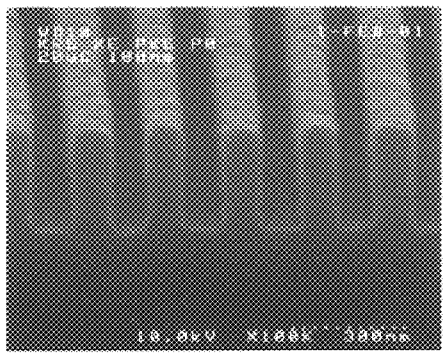
FIGS. 4a, 4b, 4c and 4d are Scanning Electron Micrographs (SEM) of KRS-XE resist coated wafers resolved to 100 nm equal lines and spaces.
Figure 4B:
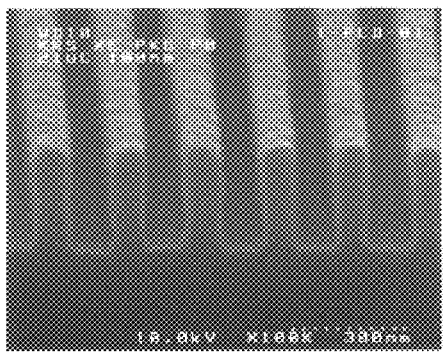
Figure 4C:
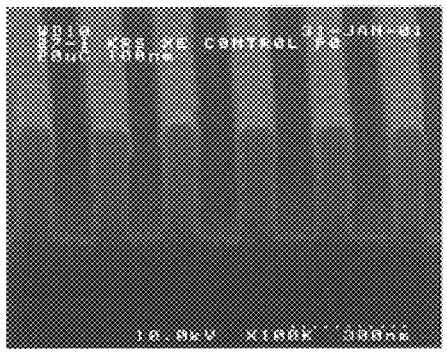
Figure 4D:
Figure 5A:
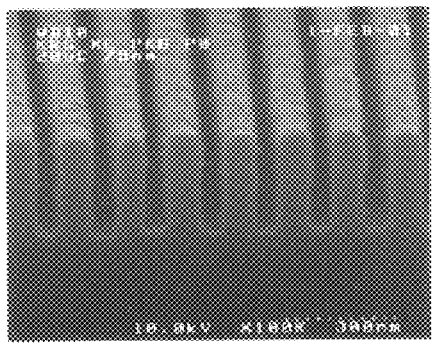
FIGS. 5a, 5b, 5c and 5d are Scanning Electron Micrographs (SEM) of KRS-XE resist coated wafers resolved to 75 nm equal lines and spaces.
Figure 5B:
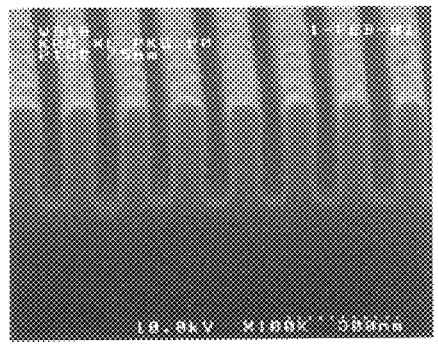
Figure 5C:
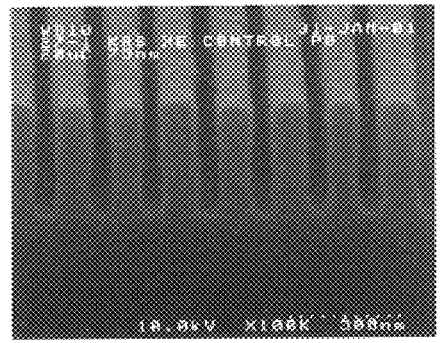
Figure 5D:
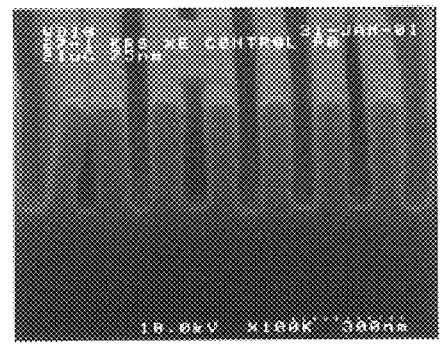

When FIG. 4a is compared with FIG. 4c, FIG. 4b compared with FIG. 4d, FIG. 5a compared with FIG. 5c and FIG. 5b compared with FIG. 5d, it is clearly seen that the results obtained for the the 50 days stored wafers and the control wafers are the same. The SEM images show that after 50 days of storage at ambient temperature and relative humidity, there was no noticeable reduction or deterioration in sensitivity, performance, image resolution or image quality of the stored resist coated silicon wafers from the controls. The KRS-XE films did not degrade even after 50 days of storage in the packaging system of the present invention.

The present invention still further includes a process for preparing a packaged coated workpiece suitable for storage for a period of at least one week without substantial loss of sensitvity, resolution or performance. The process comprises the step of sealing a coated workpiece and a getter agent in a barrier to enclose the coated workpiece and the getter agent to produce the packaged coated workpiece.

In another embodiment, the present invention also includes a process for preparing a packaged coated workpiece suitable for storage for a period of at least one week without substantial loss of sensitvity, resolution or performance. The process includes the steps of: sealing a coated workpiece and optionally a first getter agent in an inner barrier to enclose the coated workpiece and the optional first getter agent to produce a sealed first enclosure; and sealing the sealed first enclosure and optionally a second getter agent in an outer barrier to enclose the sealed first enclosure and the second optional getter agent to produce the packaged coated workpiece, provided that the packaged coated workpiece has at least one getter agent.

The sealing is typically carried out using a widely available heat-saeling device. After placing the coated workpiece in the barrier material bag or pouch, the open edge or edges of the bag or pouch are heat-pressed using the heat-saeling device. Preferably, the sealing step is repeated to obtain two or more seals, therby provide protection against a potential failure of one of the seals.

In still another embodiment, the process can further comprise sealing the sealed first enclosure and optionally an intermediate getter agent in an intermediate barrier to enclose the sealed first enclosure and the optional intermediate getter agent to form an intermediate enclosure for enclosure within the outer barrier. The process can further include forming additional intermediate barriers prior to enclosure within the outer barrier.

The present invention additionally includes a method of increasing the storage time of a coated workpiece to at least one week without substantial loss of sensitvity, resolution or performance. The method comprises packaging a coated workpiece by a process comprising the step of sealing a coated workpiece and a getter agent in a barrier to enclose the coated workpiece and the getter agent to produce the packaged coated workpiece.

In yet another embodiment, the present invention includes a method of increasing the storage time of a coated workpiece to at least one week without substantial loss of sensitvity, resolution or performance. The method comprises packaging a coated workpiece by a process comprising: sealing a coated workpiece and optionally a first getter agent in an inner barrier to enclose the coated workpiece and the optional first getter agent to produce a sealed first enclosure; and sealing the sealed first enclosure and optionally a second getter agent in an outer barrier to enclose the sealed first enclosure and the optional second getter agent to produce the packaged coated workpiece, with the proviso that the packaged coated workpiece has at least one getter agent.

The need to store plates in ambient conditions, which subjects them to moisture, acids and bases, requires control of the environment. Protection from the outside agents enables economical processing of photomasks blanks and insures that the coated resist films have a long shelf life.

The invention is further described in the following examples, which are intended to be illustrative and not limiting.

EXAMPLE 1 (COMPARATIVE)

The sensitivity of coated films is shown for KRS-E (Ketal Resist System) resist coated on silicon wafers. Resist film losses for a 3240 A film after storage of the KRS-XE resist coated on silicon wafers at room temperature in jar and development in 0.263N tetramethylammonium hydroxide (TMAH) are shown in the table below.

| Storage | Over Acetic acid | Over KOH/K2CO3 | Over Water | Over Ammonia | Control process development after PEB[a] |
|---|---|---|---|---|---|
| Film Loss, 3 days | 3240A (100%) | 105A | 395A | 210A | 115A |
| Film Loss, 15 days | | 155A | 798A | 279A | |
| Film Loss, 23 days | | 125A | 1745A | 395A | |

[a]PEB: Post Exposure Bake.

EXAMPLE 2 (COMPARATIVE)

KRS-XE coated silicon wafers were exposed to various environmental conditions and the resulting film loss was measured. Results obtained after one week at room temperature are summarized below.

| Resists | Environmental Condition | Original Thickness | Thickness After 0.263N TMAH 60s | Film loss after Development |
|---|---|---|---|---|
| KRS-XE21 | 44% Humidity (K$_2$CO$_3$ with water) | 5127 A | 5102 A | 25 A |
| KRS-XE21 | 75.7% Humidity (NaCl with water) | 5134 A | 2492 A | 2642 A |
| KRS-XE21 | Lab Air | 5109 A | 4862 A | 881 A |

EXAMPLE 3 (COMPARATIVE)

Acid Contamination Studies

KRS-XE resist coated silicon wafers were prepared and the film thickness of the coating was measured. The coated silicon wafers were placed in an environmental test chamber and stored for a predetermined period of time. After storage for the specified period of time, the coated silicon wafers were immersed in a 0.263N tetramethylammonium hydroxide (TMAH) developer for 60 seconds and the film thickness of the coating was measured again. Film loss after development was measured and recorded.

The amounts of film loss after development are shown in the table below.

| Experimental Conditions | Storage Time | Original Film Thickness | Thickness of Film After Development | Film Loss After Development | Comments |
|---|---|---|---|---|---|
| Acetic acid/Water (50/50) Mole ratio | 0 hour | 5160 A | 5122 A | 38 A | |
| Acetic acid/Water (50/50) Mole ratio | 1 hour | 5178 A | 3554 A | 1624 A | |
| Acetic acid/Water (50/50) Mole ratio | 2 hours | 5133 A | 4252 A | 881 A | Film flushed with nitrogen until no smell of acetic acid |
| Acetic acid/Water (50/50) Mole ratio | 2 hours | 5122 A | 4110 A | 1021 A | ½ hr wait before development |
| Acetic acid/Water (50/50) Mole ratio | 19 hours | 5138 A | 0[a] | 5138A[b] | |
| Acetic acid/Water (50/50) Mole ratio | 19 hours | 5152 A | 0[a] | 5152A[b] | Pumped in Vacuum for 3 hours |

[a]Dissolved in 2–3 seconds
[b]The entire original film was lost

EXAMPLE 4 (COMPARATIVE)

Temperature and Humidity (RH) Chamber Studies

Aging at different temperatures and humidities of KRS-XE resist coated silicon wafers in a Relative Humidity Chamber, i.e., in an RH Chamber, in the absence of getter agents was investigated. Plot of film loss versus wafer aging time is shown in FIG. 3. In the absence of getter agents, film loss after 30 days of storage was significant even at low temperatures and humidity, such as, at 20° C. temperature and 44% relative humidity. At higher temperatures and humidities, film loss after just a few days of storage was dramatic.

EXAMPLE 5

A KRS-XE resist coated silicon wafer having a film thickness of 350 nm was packed according to the present invention in Moisture Barrier Bag® aluminum-metallized polyester having static dissipative polyethylene packaging material, available from 3M Company, Minneapolis, Minn., in the presence of a premixed Silica Gel/Charcoal in pillow pack as the getter agent, available from Donaldson, Inc., Minneapolis, Minn. Potassium carbonate was also included as an additional getter agent in a separate pillow pack. The packaged resist coated wafer was stored at ambient temperature and relative humidity for 50 days. Thereafter, the aged KRS-XE resist coated silicon wafer was exposed patternwise to a 75 kV electron beam radiation and then developed in 0.263N tetramethylammonium hydroxide (TMAH) to produce 100 nm and 75 nm lines and space features. The controls were not stored, i.e., were not subjected to humidity. They were patternwise exposed to electron beam radiation and developed on the same day. The experimental details and results obtained are summarized herein below and in FIGS. 4a, 4b, 4c, 4d, 5a, 5b, 5c and 5d.

FIGS. 4a, 4b, 4c and 4d: Scanning Electron Micrographs (SEM) of KRS-XE resolved to 100 nm equal lines and spaces using two doses and after differing degrees of storage: a) 20 $\mu C/cm^2$ after 50 days storage; b) 21 $\mu C/cm^2$ after 50 days storage; c) 20 $\mu C/cm^2$ after 0 days storage (control); d) 21 $\mu C/cm^2$ after 0 days storage (control). FIGS. 5a, 5b, 5c and 5d: Scanning Electron Micrographs (SEM) of KRS-E resolved to 75 nm equal lines and spaces using two doses and after differing degrees of storage: a) 20 $\mu C/cm^2$ after 50 days storage; b) 21 $\mu C/cm^2$ after 50 days storage; c) 20 $\mu C/cm^2$ after 0 days storage (control); d) 21 $\mu C/cm^2$ after 0 days storage (control). FIG. 4a is compared with FIG. 4c; FIG. 4b is compared with FIG. 4d; FIG. 5a is compared with FIG. 5c; and FIG. 5b is compared with FIG. 5d. It is clearly seen from the Figures that the results obtained are the same for the control wafers, which are not stored, and the 50 days stored wafers. The above described SEM images show that the KRS-XE films do not degrade even after 50 days of storage in the above described packaging system. Thus, after 50 days of storage at ambient temperature and relative humidity, there was no noticeable reduction or deterioration in sensitivity, performance, image resolution or image quality of the stored resist coated silicon wafers when compared with the resist coated silicon wafer controls, which were not stored.

The present invention has been described with particular reference to the preferred embodiments. It should be understood that the foregoing descriptions and examples are only illustrative of the invention. Various alternatives and modifications thereof can be devised by those skilled in the art without departing from the spirit and scope of the present invention. Accordingly, the present invention is intended to embrace all such alternatives, modifications, and variations that fall within the scope of the appended claims.

What is claimed is:

1. A packaged coated workpiece comprising:
   a workpiece coated with a resist film sensitive to optical radiation, particulates or chemical contaminants;
   a sealed enclosure comprising one or more barriers for isolating said coated workpiece from an outside environment; and
   one or more getter agents for producing an enclosure substantially free of chemical contaminants;
   wherein said packaged coated workpiece is suitable for storage for a period of at least one week without substantial loss of sensitvity, resolution or process latitude.

2. The packaged coated workpiece of claim 1, wherein said resist film is a chemically amplified resist or a non-chemically amplified resist.

3. The packaged coated workpiece of claim 2, wherein said coated workpiece is a resist-coated mask blank.

4. The packaged coated workpiece of claim 3, wherein said coated workpiece is a resist-coated chrome film on a quartz blank.

5. The packaged coated workpiece of claim 1, wherein said workpiece is a substrate suitable for microelectronic device fabrication.

6. The packaged coated workpiece of claim 1, wherein said workpiece is a substrate suitable for fabrication of a mask selected from the group consisting of an electron beam, x-ray, particle beam, excited state atom beam, ion beam and photo mask.

7. The packaged coated workpiece of claim 1, wherein said sealed enclosure comprises an inner barrier and an outer barrier.

8. The packaged coated workpiece of claim 7, wherein said inner and outer barriers are formed from a material which is impervious to optical radiation and particulates.

9. The packaged coated workpiece of claim 8, wherein said particulates comprise dust.

10. The packaged coated workpiece of claim 8, wherein said optical radiation is selected from the group consisting of ultraviolet (UV) radiation and visible radiation.

11. The packaged coated workpiece of claim 10, wherein said ultraviolet (UV) radiation is a deep ultraviolet radiation.

12. The packaged coated workpiece of claim 7, wherein said inner and outer barriers are formed from a material which is impervious, to a chemical contaminant, with the proviso that said inner barrier optionally has one or more openings for making said inner barrier pervious to said chemical contaminants.

13. The packaged coated workpiece of claim 12, wherein said one or more openings in said inner barrier optionally are covered by a microporous material thereby making said one or more covered openings impervious to particulates.

14. The packaged coated workpiece of claim 13, wherein said chemical contaminant is a solid, liquid or vapor contaminant capable of causing a reduction in at least one performance property of said coated workpiece.

15. The packaged coated workpiece of claim 13, wherein said chemical contaminant comprises an acid precursor or a base precursor.

16. The packaged coated workpiece of claim 15, wherein said acid precursor comprises $NO_2$ and $SO_2$ emissions and moisture.

17. The packaged coated workpiece of claim 13, wherein said chemical contaminant is an acid or a base.

18. The packaged coated workpiece of claim 13, wherein said chemical contaminant is moisture.

19. The packaged coated workpiece of claim 8, wherein said inner and outer barriers are formed from a material selected from the group consisting of: a metal foil, a plastic and a filled plastic.

20. A packaged coated workpiece comprising:
   a workpiece coated with a resist film sensitive to optical radiation, particulates or chemical contaminants;
   a sealed enclosure comprising an inner barrier and outer barrier for isolating said coated workpiece from an outside environment; and at least one getter agent enclosed within said inner barrier and/or said outer barrier for producing an enclosure substantially free of chemical contaminants;

wherein said packaged coated workpiece is suitable for storage for a period of at least three months without substantial loss of sensitvity, resolution or process latitude.

21. A packaged coated workpiece comprising:

a workpiece coated with a resist film sensitive to optical radiation, particulates or chemical contaminants;

an inner barrier sealed to enclose said coated workpiece and optionally a first getter agent, to produce a sealed first enclosure; and an outer barrier sealed to enclose said sealed first enclosure and optionally a second getter agent, to produce a packaged coated workpiece suitable for storage for a period of at least one week without substantial loss of sensitvity, resolution or performance, with the proviso that said packaged coated workpiece has at least one getter agent.

22. The packaged coated workpiece of claim 21, wherein said resist film is a chemically amplified resist or a non-chemically amplified resist.

23. The packaged coated workpiece of claim 22, wherein said coated workpiece is a resist-coated mask blank.

24. The packaged coated workpiece of claim 23, wherein said coated workpiece is a resist-coated chrome film on a quartz blank.

25. The packaged coated workpiece of claim 21, wherein said workpiece is a substrate suitable for microelectronic device fabrication.

26. The packaged coated workpiece of claim 21, wherein said workpiece is a substrate suitable for fabrication of a mask selected from the group consisting of an electron beam, x-ray, particle beam, excited state atom beam, ion beam and photo mask.

27. The packaged coated workpiece of claim 21, wherein said inner and outer barriers are formed from a material which is impervious to optical radiation and particulates.

28. The packaged coated workpiece of claim 27, wherein said particulates comprise dust.

29. The packaged coated workpiece of claim 27, wherein said optical radiation is selected from the group consisting of: ultraviolet (UV) radiation and visible radiation.

30. The packaged coated workpiece of claim 29, wherein said ultraviolet (UV) radiation is a deep ultraviolet radiation.

31. The packaged coated workpiece of claim 21, wherein said inner and outer barriers are formed from a material which is impervious, to a chemical contaminant, with the proviso that said inner barrier optionally has one or more openings for making said inner barrier pervious to said chemical contaminants.

32. The packaged coated workpiece of claim 31, wherein said one or more openings in said inner barrier optionally are covered by a microporous material thereby making said one or more covered openings impervious to particulates.

33. The packaged coated workpiece of claim 32, wherein said chemical contaminant is a solid, liquid or vapor contaminant capable of causing a reduction in at least one performance property of said coated workpiece.

34. The packaged coated workpiece of claim 32, wherein said chemical contaminant comprises an acid precursor or a base precursor.

35. The packaged coated workpiece of claim 34, wherein said acid precursor comprises $NO_2$ and $SO_2$ emissions and moisture.

36. The packaged coated workpiece of claim 32, wherein said chemical contaminant is an acid or a base.

37. The packaged coated workpiece of claim 32, wherein said chemical contaminant is moisture.

38. The packaged coated workpiece of claim 21, wherein each of said first and said second getter agents is capable of maintaining within said enclosures a relative humidity level of less than 25% at room temperature.

39. The packaged coated workpiece of claim 38, wherein each of said first and said second getter agents is independently selected from the group consisting of: a chemical drying agent, an absorbent for water, an absorbent for a base, an absorbent for an acid, an absobent for a gas and a combination thereof.

40. The packaged coated workpiece of claim 39, wherein each of said first and said second getter agents is independently selected from the group consisting of alumina, silica gel, activated charcoal, citric acid, potassium carbonate, an amine and a combination thereof.

41. The packaged coated workpiece of claim 40, wherein each of said first and said second getter agents is a combination of silica gel, activated charcoal and potassium carbonate.

42. The packaged coated workpiece of claim 21, wherein at least some of said first or said second getter agent is enclosed in a microporous material.

43. The packaged coated workpiece of claim 21, wherein said microporous material is a fluorinated hydrocarbon material.

44. The packaged coated workpiece of claim 43, wherein said fluorinated hydrocarbon material is selected from the group consisting of: a fluorocarbon, vinylidene fluoride homopolymer, vinylidene fluoride copolymer, Goretex™, Teflon™ and a combination thereof.

45. The packaged coated workpiece of claim 21, wherein said said inner and outer barriers are formed from a material selected from the group consisting of a metal foil, a plastic and a filled plastic.

46. The packaged coated workpiece of claim 45, wherein said said material is selected from the group consisting of: a carbon filled plastic, grafite filled plastic, metal particle, metal platelet or metal fibre filled plastic, organic or inorganic ionic conductor filled plastic, ultraviolet absorber containing plastic, infrared absorber containing plastic, and a combination thereof.

47. The packaged coated workpiece of claim 21, wherein each of said inner barrier and said outer barrier is a sealable bag.

48. The packaged coated workpiece of claim 21, further comprising between said inner barrier and said outer barrier, an intermediate barrier sealed to enclose said sealed first enclosure and optionally an intermediate getter agent, to produce a sealed intermediate enclosure.

49. The packaged coated workpiece of claim 48, further comprising additional intermediate barriers.

* * * * *